US010906173B2

(12) United States Patent
Peng

(10) Patent No.: US 10,906,173 B2
(45) Date of Patent: Feb. 2, 2021

(54) SMART CABINET

(71) Applicant: ZEZHI INTELLECTUAL PROPERTY SERVICE, Shenzhen (CN)

(72) Inventor: Zhihong Peng, Hong Kong (HK)

(73) Assignee: ZEZHI INTELLECTUAL PROPERTY SERVICE, Shenzhen (CN)

( * ) Notice: Subject to any disclaimer, the term of this patent is extended or adjusted under 35 U.S.C. 154(b) by 244 days.

(21) Appl. No.: 16/191,466

(22) Filed: Nov. 15, 2018

(65) Prior Publication Data
US 2020/0156238 A1 May 21, 2020

(51) Int. Cl.
B25J 9/10 (2006.01)
B25J 9/00 (2006.01)
H05K 5/02 (2006.01)
B25J 9/12 (2006.01)
B25J 9/08 (2006.01)

(52) U.S. Cl.
CPC .......... B25J 9/1005 (2013.01); B25J 9/0009 (2013.01); B25J 9/08 (2013.01); B25J 9/12 (2013.01); H05K 5/0204 (2013.01); H05K 5/0234 (2013.01)

(58) Field of Classification Search
CPC ......... B25J 9/10; B25J 9/12; B25J 9/08; B25J 9/00; H05K 5/02
See application file for complete search history.

(56) References Cited

U.S. PATENT DOCUMENTS

| 10,507,914 | B2 * | 12/2019 | Walker | B64F 3/00 |
| 10,604,258 | B2 * | 3/2020 | Singleton | B64D 11/04 |
| 2004/0164505 | A1 * | 8/2004 | Clemens | B60K 7/0023 280/6.154 |
| 2005/0063801 | A1 * | 3/2005 | Durand | B65G 1/1376 414/268 |
| 2007/0035220 | A1 * | 2/2007 | Bond | A47B 88/90 312/319.1 |
| 2014/0005683 | A1 * | 1/2014 | Stand | A61B 1/0057 606/130 |

* cited by examiner

Primary Examiner — Kira Nguyen
(74) Attorney, Agent, or Firm — WPAT, PC

(57) ABSTRACT

The application relates to a smart cabinet. The smart cabinet includes a cabinet body, a moving module, a controlling module and an assisting module. The moving module is positioned in the cabinet body; the controlling module is connected to the moving module. The moving module includes a base, a guiding wheel group disposed on the base, a plurality of drivers pivotally connected with the guiding wheel group, and a manipulator disposed on the base. The controlling module includes an input control unit, a guiding rope, and a pulley group. The input control module is electrically connected with the drivers and the manipulator. The pulley group includes a plurality of pulleys defining a movement range for the moving module. The assisting module includes a rope retractor and a sensor electrically coupled to the rope retractor. Two ends of the guiding rope are coupled to the rope retractor.

10 Claims, 3 Drawing Sheets

SMART CABINET

FIELD OF THE DISCLOSURE

The disclosure relates to the field of smart home technologies, and more particularly to a smart cabinet BACKGROUND With the development of the internet and the improvement of people's living standards, traditional cabinets are inconvenient to use by manually placing or taking objects, which cannot satisfy the people's pursuit of smart homes.

SUMMARY

In the disclosure, a smart cabinet is provided. The smart cabinet comprises a cabinet body, a moving module, a controlling module and an assisting module. The moving module is positioned in the cabinet body, and the controlling module is connected to the moving module and configured for controlling a movement of the moving module. The moving module comprises a base, a guiding wheel group disposed on the base, a plurality of drivers pivotally connected with the guiding wheel group, and a manipulator disposed on the base. The controlling module comprises an input control unit, a guiding rope and a pulley group; the input control unit is electrically connected with the plurality of drivers and the manipulator, the pulley group comprises a plurality of pulleys respectively positioned at predetermined end points, and the plurality of pulleys cooperate to define a movement range for the moving module. The assisting module comprises a rope retractor and a sensor electrically connected with the rope retractor, and two ends of the guiding rope are coupled to the rope retractor. The input control unit is configured for generating displacement control signals correspondingly when receives a displacement instruction, and controlling the plurality of drivers to drive the guiding wheel group to rotate and thereby drive the guiding rope according to the displacement control signals, so as to change a position of the moving module. The sensor is configured for detecting a tension of the guiding rope, and controlling the rope retractor to release or retract the guiding rope according to a result of the detecting and thereby maintain the tension of the guiding rope in a predetermined range, so as to make the moving module move to a target position in the movement range corresponding to the displacement instruction. The manipulator comprises a telescopic mechanism and a clamping mechanism, the telescopic mechanism is arranged between the base and the clamping mechanism, and the clamping mechanism is configured for clamping or releasing a target object.

Based on the cooperation of the moving module, the controlling module and the assisting module, through an optimized operation mode, the moving module can be easily moved to any position in the cabinet body; the manipulator of the moving module can automatically grasp or release a target object, thereby enabling the smart cabinet more efficient and intelligent. In addition, the clamping mechanism of the moving module forms a hollow cylindrical structure, which can protect the target object from being damaged when grasping or loosening a fragile or deformable object, so it can be applied to special industries.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the drawings.

DETAILED DESCRIPTION OF PREFERRED EMBODIMENTS

In order to further illustrate the technical means and functions of the disclosure for achieving the intended purpose of the disclosure, the following describes the specific embodiments, structures, features, and effects of a smart cabinet in detail, with reference to the accompanying drawings and preferred embodiments.

Figure 1:
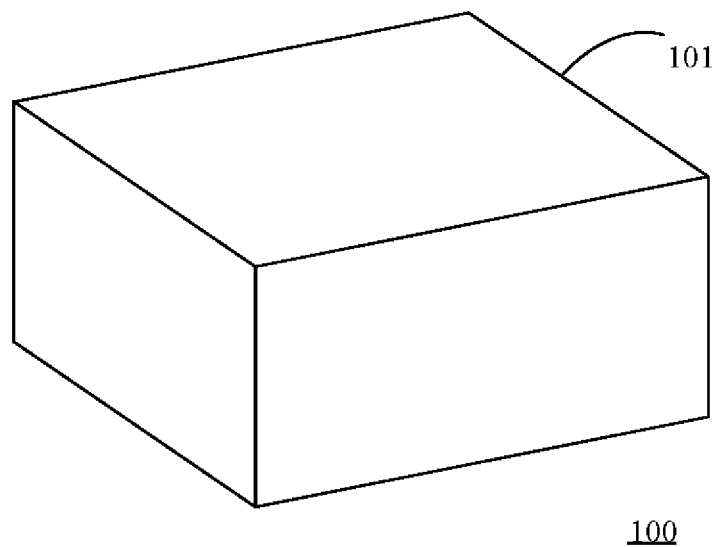
FIG. 1 is a schematic diagram of a smart cabinet according to an embodiment of the disclosure.
Figure 2:
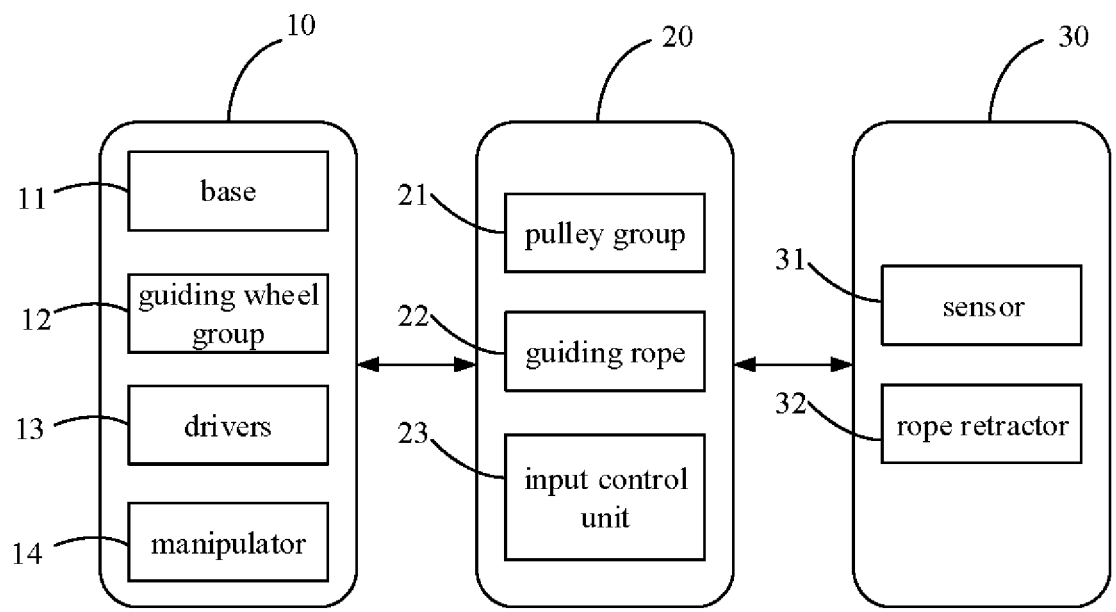
FIG. 2 is a module structure diagram of the smart cabinet of FIG. 1.

As shown in FIG. 1 and FIG. 2, an embodiment of the disclosure provides a smart cabinet 100, including a cabinet body 101, a moving module 10, a controlling module 20, and an assisting module 30.

Figure 3:
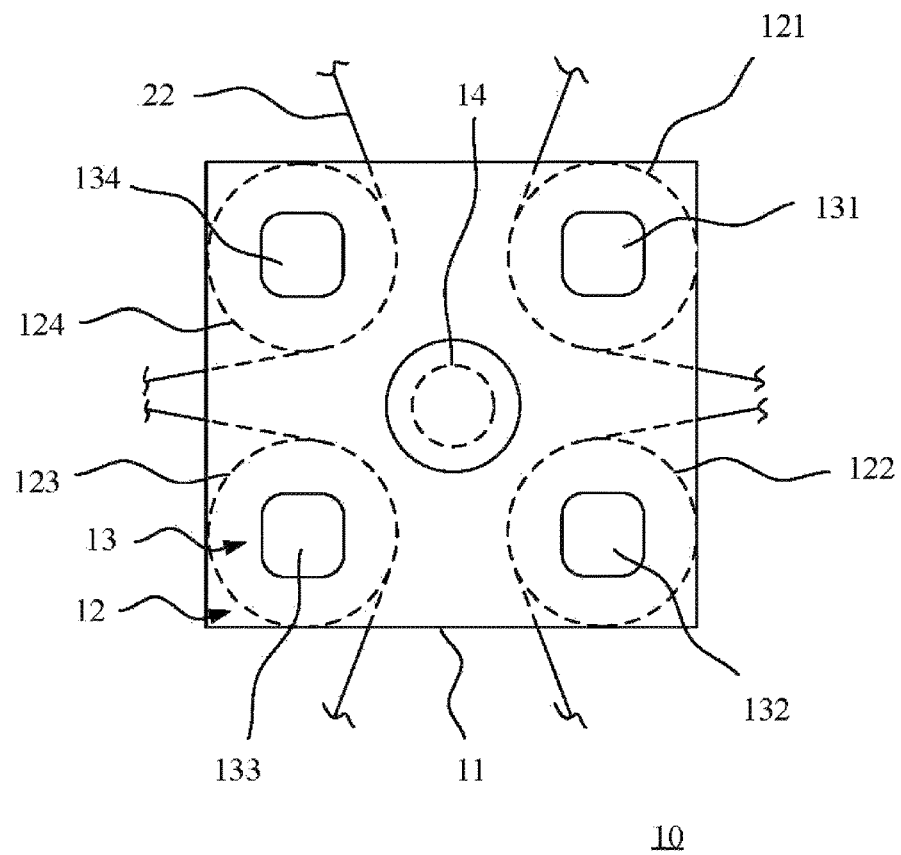
FIG. 3 is a schematic diagram of a moving module of the smart cabinet of FIG. 1.

Referring to FIG. 2 and FIG. 3, the moving module 10 is positioned in the cabinet body 101. The controlling module 20 is connected to the moving module 10, and is configured for controlling the movement of the moving module 10. The moving module 10 includes a base 11, a guiding wheel group 12 disposed on the base 11, a plurality of drivers 13 pivotally connected to the guiding wheel group 12, and a manipulator 14 disposed under the base 11.

Figure 4:
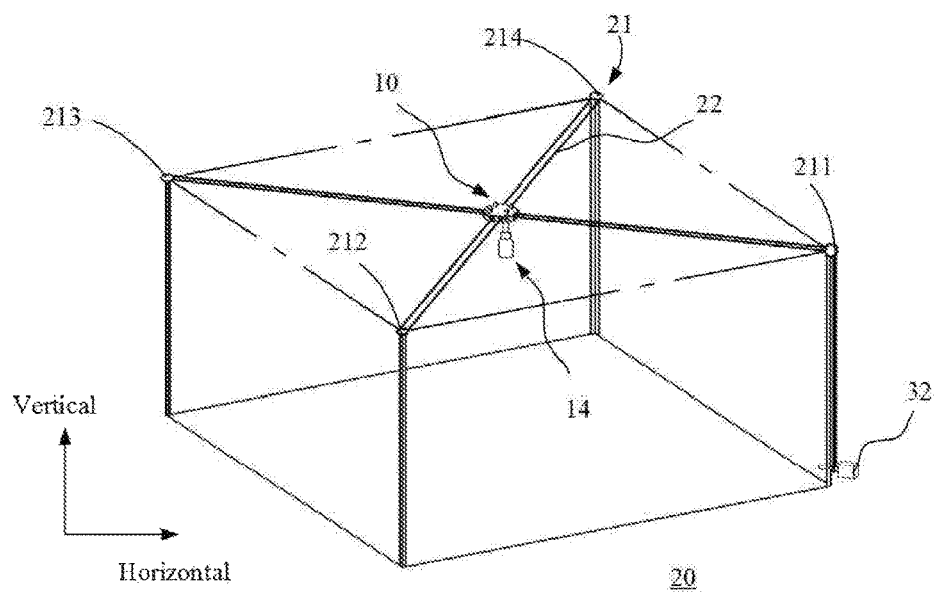
FIG. 4 is a schematic structural diagram of the smart cabinet of FIG. 1.

Referring to FIG. 2 and FIG. 4, the controlling module 20 includes a pulley group 21, a guiding rope 22, and an input control unit 23. The input control unit 23 is electrically connected to the drives 13 and the manipulator 14. The pulley group 21 has a number of pulleys respectively disposed at predetermined end points, and the pulleys cooperate with each other to define a movement range F for the moving module 10.

The assisting module 30 includes a rope retractor 32 and a sensor 31 electrically connected with the rope retractor 32. Two ends of the guiding rope 22 are coupled to the rope retractor 32.

When the input control unit 23 receives a displacement instruct, displacement control signals corresponding to the displacement instruction will be generated. According to the displacement control signals, the drivers 13 are controlled to drive the guiding wheel group 12 to rotate and thereby the guiding rope 22 is driven, to change the location of the moving module 10. The sensor 31 is capable of detecting the tension of the guiding rope 22, and controls the rope retractor 32 to extend or retract the guiding rope 22 according to a result of detecting and thereby maintain the tension of the guiding rope 22 in a predetermined range, so that the moving module 10 is moved in the movement range F and moved to a target position corresponding to the displacement instruction. And then a clamping mechanism 142 of the manipulator 14 can be enabled to clamp or release a target object.

Referring to FIG. 3 again, the base 11 can be circular or polygonal in shape. In this embodiment, the base 11 has a square shape, and the guiding wheel group 12 has a first guiding wheel 121, a second guiding wheel 122, a third guiding wheel 123, and a fourth guiding wheel 124, spaced apart from one another and respectively disposed at four corners of the base 11. The first guiding wheel 121, the second guiding wheel 122, the third guiding wheel 123, and the fourth guiding wheel 124 have the same radius.

The plurality of drivers 13 includes four drivers, which are disposed at four corners of the base 11 spaced apart from one another to drive the four guiding wheels 121-124 respectively. The one driving the first guiding wheel 121 is labeled as a first driver 131, the one driving the second guiding wheel 122 is labeled as a second driver 132, the one driving the third guiding wheel 123 is labeled as a third driver 133, and the one driving the fourth guiding wheel 124 is labeled as a fourth driver 134.

The input control unit 23 can include a video monitor and a touch display screen or a voice control recognizer, but is not limited thereto. When the input control unit 23 includes a video monitor and a touch display screen, the video monitor can capture the placement of objects in the cabinet body 101, and the touch display screen can input a displacement instruction by clicking. For example, the user can observe the position where a target object is placed through the video monitor, and then click a predetermined position of the touch display screen according to a predetermined manner, as such, a displacement instruction can be generated to move the moving module 10 and enable the manipulator 14 to grasp the target object.

Referring to FIG. 4, the pulley group 21 includes a first pulley 211, a second pulley 212, a third pulley 213, and a fourth pulley 214 respectively disposed at four vertices of the cabinet body 101. The first pulley 211 is vertically arranged, and the second pulley 212, the third pulley 213, and the fourth pulley 214 are horizontally arranged. The first pulley 211, the second pulley 212, the third pulley 213, and the fourth pulley 214 may have the same radius, and cooperate together to define a rectangular movement range F for the moving module 10.

Figure 5:
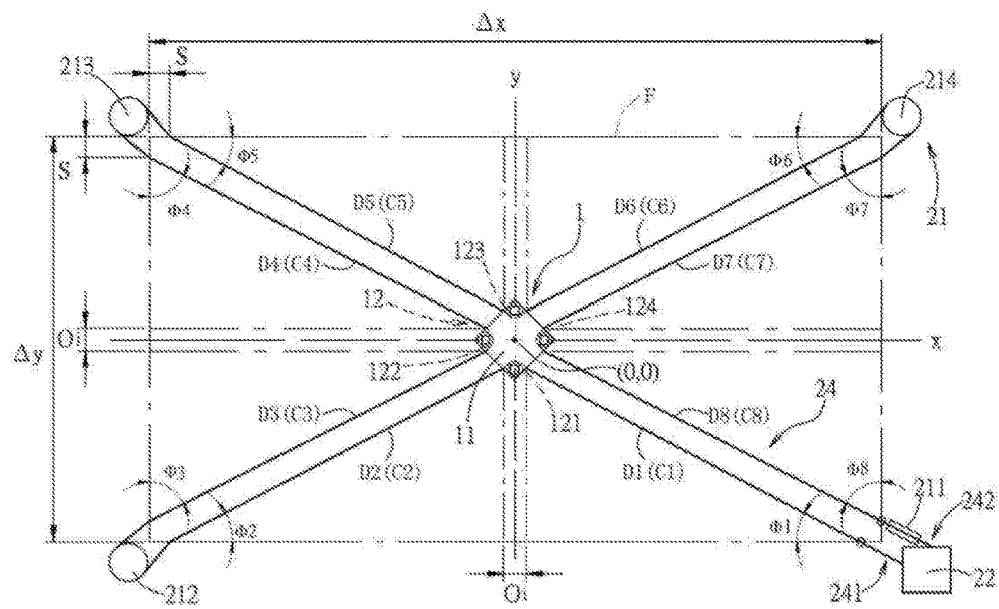
FIG. 5 is a schematic structural diagram of a controlling module of the smart cabinet of FIG. 1.

Referring to FIG. 5, the guiding rope 22 extends between the guiding wheel group 12 and the pulley group 21 in a predetermined order, and two ends of the guiding rope 22 are coupled to the rope retractor 32. In detail, the rope retractor 32 may be a winder having a roller, and the rope retractor 32 locates corresponding to the first pulley 211. Two ends of the guiding rope 22 are respectively named as a fixed end 221 and an adjustment end 222 opposite to the fixed end 221. The sensor 31 can be disposed in the roller of the rope retractor 32, and the adjustment end 222 of the guiding rope 22 is connected to the sensor 31 and can be driven by the roller of the rope retractor 32. The sensor 31 detects the tension of the guiding rope 22, and controls the rotation of the roller of the rope retractor 32 according to the detecting result. When the roller of the rope retractor 32 rotates, the guiding rope 22 can be released or rolled up.

The guiding rope 22 includes a first segment D1 between the fixed end 221 and the first guiding wheel 121, a second segment D2 extending from the first guiding wheel 121 to the second pulley 212, a third segment D3 extending from the second pulley 212 to the second guiding wheel 122, a fourth segment D4 extending from the second guiding wheel 122 to the third pulley 213, a fifth segment D5 extending from the third pulley 213 to the third guiding wheel 123, a sixth segment D6 extending from the third guiding wheel 123 to the fourth pulley 214, a seventh segment D7 extending from the fourth pulley 214 to the fourth guiding wheel 124, and an eighth segment D8 extending from the fourth guiding wheel 124 to the first pulley 211. When the first guiding wheel 121, the second guiding wheel 122, the third guiding wheel 123, or the fourth guiding wheel 124 rotates, the guiding rope 22 is driven, and when the guiding rope 22 is driven, then the first pulley 211, the second pulley 212, the third pulley 213 and the fourth pulley 214 are driven to rotate. In other words, the first pulley 211, the second pulley 212, the third pulley 213, and the fourth pulley 214 are driven by the guiding rope 22, and the guiding rope 22 is driven by the first guiding wheel 121, the second guiding wheel 122, the third guiding wheel 123, and the fourth guiding wheel 124.

Figure 6:
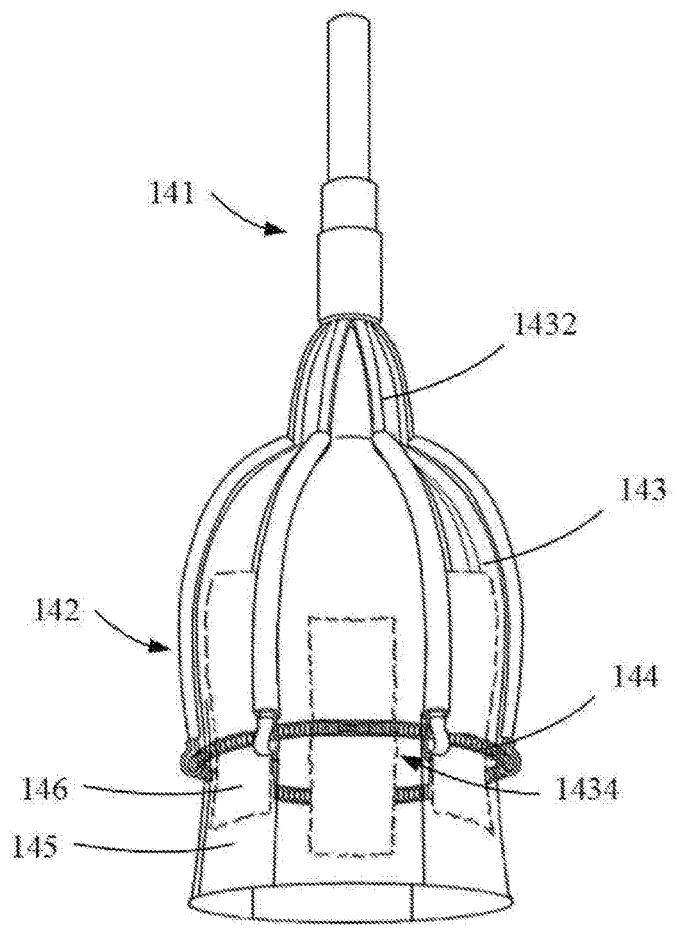
FIG. 6 is a schematic diagram of a manipulator of the smart cabinet of FIG. 1.

Referring to FIG. 6, the manipulator 14 includes a telescopic mechanism 141 and the clamping mechanism 142. The telescopic mechanism 141 is located between the base 11 and the clamping mechanism 142. The telescopic mechanism 141 of the manipulator 14 may be an automatic telescopic mechanism. For example, the manipulator 14 may further include a driving cylinder (not shown) disposed at the base 11, and the driving cylinder is connected to the input control unit 23. The driving cylinder can drive the telescopic mechanism 141 to be extended or shorted, according to a control instruction from the input control unit 23. The clamping mechanism 142 includes a frame 143, an elastic element 144, a supporting member 145, and a number of cushions 146. One end of the frame 143 that connected to the telescopic mechanism 141 defines a limited opening 1432, and an opposite end of the frame 143 defines a adjustable opening 1434. The elastic element 144 is disposed at the end of the frame 143 defining the adjustable opening 1434. The supporting member 145 and the elastic element 144 are located in the adjustable opening 1434, and the cushions 146 are located at an inner side of the supporting member 145. The supporting member 145 can include a plurality of elastic sheets. The frame 143 can be an automatic structure capable of being opened and tightened, for example, when the driving cylinder applies a pushing force or a pressing force to the end of the frame 143 with the limited opening 1432, the end of the frame 143 with the adjustable opening 1434 can be tightened and form a clamping force on a target object, so the target object can be grasped.

The manipulator 14 can automatically reach the target object. When the moving module 10 is moved to a designated position, the input control unit 23 can automatically control the manipulator 14 to automatically grasp or release the target object. In particular, the frame 143, the elastic element 144, the supporting member 145, and the cushions 146 together form a hollow cylindrical structure, which can protect the target object from being damaged when grasping or releasing a fragile or deformable object.

Referring to FIGS. 1-6, using processes of the smart cabinet 100 are described as follows. First, a displacement instruction is input through the input control unit 23; the input control unit 23 generates target coordinates according to the displacement instruction, the target coordinates represent a position where the moving module 10 is moved to reach in the movement range F; and based on initial coordinates, the input control unit 23 calculates respective initial length (represented as C1 to C8 in FIG. 5) of the first segment D1 to the eighth segment D8 before the moving module 10 moves, where the initial coordinates represent an initial position before the moving module 10 moves.

The initial lengths of the first segment D1 to the eighth segment D8 can be calculated as follows: defining an x-axis horizontally extending through the center of the moving range F and a y-axis longitudinally extending through the center of the moving range F, and then the center of the moving range F is defined to be an origin of coordinates (0,0) in a plane coordinate system; according to the following formulas (1) to (12), calculating the respective initial lengths (represented as C1 to C8) of the first segment D1 to the eighth segment D8 before the moving module 10 moves, through the input control unit 23.

$$C1 \sin \Phi 1 = C2 \sin \Phi 2 \quad (1)$$

$$C3 \sin \Phi 3 = C4 \sin \Phi 4 \quad (2)$$

$$C5 \sin \Phi 5 = C6 \sin \Phi 6 \quad (3)$$

$$C7 \sin \Phi 7 = C8 \sin \Phi 8 \quad (4)$$

$$\Delta y - Oi - 2S = C1 \cos \Phi 1 = C2 \cos \Phi 2 \quad (5)$$

$$\Delta x - Oi - 2S = C3 \cos \Phi 3 = C4 \cos \Phi 4 \quad (6)$$

$$\Delta y - Oi - 2S = C5 \cos \Phi 5 = C6 \cos \Phi 6 \quad (7)$$

$$\Delta x - Oi - 2S = C7 \cos \Phi 7 = C8 \cos \Phi 8 \quad (8)$$

$$(C1 \cos \Phi 1 + C2 \cos \Phi 2)^2 = C1^2 + C2^2 - 2C1C2 \cos(180 - \Phi 1 - \Phi 2) \quad (9)$$

$$(C3 \cos \Phi 3 + C4 \cos \Phi 4)^2 = C3^2 + C4^2 - 2C3C4 \cos(180 - \Phi 3 - \Phi 4) \quad (10)$$

$$(C5 \cos \Phi 5 + C6 \cos \Phi 6)^2 = C5^2 + C6^2 - 2C5C6 \cos(180 - \Phi 5 - \Phi 6) \quad (11)$$

$$(C7 \cos \Phi 7 + C8 \cos \Phi 8)^2 = C7^2 + C8^2 - 2C7C8 \cos(180 - \Phi 7 - \Phi 8) \quad (12)$$

Where $\Delta x$ refers to a width of the movement range F; $\Delta y$ refers to a length of the movement range F; S refers to a distance between the intersection of the guiding rope 22 and the movement range F and a corresponding vertex, S may be equal to the diameter of the pulley in the pulley group 21; Oi refers to a distance between two intersections at which the guiding rope intersects the periphery of the base 11, the two intersections are positioned at two opposite sides of the same guiding wheel, Oi may be equal to the diameter of the guiding wheel; C1 to C8 refer to the initial length of the first segment D1 to the eighth segment D8, respectively; $\Phi 1$ to $\Phi 8$ refer to a minimum intersection angle between the periphery of the movement range F and the first segment D1 to the eighth segment D8, respectively.

Next, according to the target coordinates, the input control unit 23 calculates the respective target lengths (represented as C1' to C8') of the first segment D1 to the eighth segment D8 after the moving module 10 moves to the target coordinates, the target lengths are calculated in a similar way to that of the initial lengths.

Next, according to the calculated initial lengths and the target lengths, the input control unit 23 calculates a first length variation corresponding to the first segment D1, a second length variation corresponding to the second segment D2, a third length variation corresponding to the third segment D3, a fourth length variation corresponding to the fourth segment D4, a fifth length variation corresponding to the fifth segment D5, a sixth length variation corresponding to the sixth segment D6, a seventh length variation corresponding to the seventh segment D7, and an eighth variation corresponding to the eighth segment D8. For example, the first length variation represents the length change of the first segment D1 before and after the movement of the moving module 10, that is, the difference between the initial length and the target length of the first segment D1.

The input control unit 23 may generate displacement control data corresponding to the displacement instruction according to the calculated first length variation to the eighth length variation. The displacement control data may further include a first rotation direction, a second rotation direction, a third rotation direction, a fourth rotation direction, a first rotation angle, a second rotation angle, a third rotation angle, a fourth rotation angle, a first rotation speed, a second rotation speed, a third rotation speed, and a fourth rotation speed. The first rotation direction, the first rotation angle and the first rotation speed are corresponding to the first driver 131, the second rotation direction, the second rotation angle and the second rotation speed are corresponding to the second driver 132, and so on.

In detail, the manner in which the input control unit 23 generates the displacement control data is described below. At first, a first driven length corresponding to the first guiding wheel 121, a second driven length corresponding to the second guiding wheel 122, a third driven length corresponding to the third guiding wheel 123, and a fourth driven length corresponding to the fourth guiding wheel 124 are calculated according to the first length variation to the eight length variation. The first driven length to the fourth driven length respectively represent the length of the guiding rope 22 required to be driven by each of the first guiding wheel 121 to the fourth guiding wheel 124. Next, the input control unit 23 determines the first rotation direction to the fourth rotation direction according to the first through fourth driven lengths, and calculates the first through fourth rotation angles. Then, the first rotation speed to the fourth rotation speed are calculated according to the first rotation angle to the fourth rotation angle and a predetermined rotation time.

The method of calculating the first to fourth driving lengths is described below according to the following formulas (13)~(17), and the first driven length to the fourth driven length are respectively defined as $\Delta Ca$, $\Delta Cb$, $\Delta Cc$, and $\Delta Cd$.

$$\Delta Cn = Cn - Cn' \quad (13)$$

$$\Delta Ca = \Delta C1 = C1 - C1' \quad (14)$$

$$\Delta Cb = \Delta C2 + \Delta C3 + \Delta Ca = C2 - C2' + C3 - C3' + \Delta Ca \quad (15)$$

$$\Delta Cc = \Delta C4 + \Delta C5 + \Delta Cb = C4 - C4' + C5 - C5' + \Delta Cb \quad (16)$$

$$\Delta Cd = \Delta C6 + \Delta C7 + \Delta Cc = C4 - C4' + C5 - C5' + \Delta Cb \quad (17)$$

The first rotation direction to the fourth rotation direction are respectively related to whether the first to fourth driven lengths are positive or negative, and each may be a clockwise direction or a counterclockwise direction. For example, if the first driven length is a positive value, the initial length of the first segment D1 is greater than the target length (C1>C1'). That is, when the moving module 10 moves from the initial coordinates to the target coordinates, the first segment D1 needs to be gradually shortened. Referring to FIG. 5, the first rotation direction should be a counterclockwise direction, so that the first guiding wheel 121 rotates to transfer a portion of the first segment D1 to the second segment D2. On the other hand, if the first driven length is a negative value, it means that the initial length of the first segment D1 is smaller than the target length (C1<C1'). That is, when the moving module 10 moves from the initial coordinates to the target coordinates, the first segment D1 needs to be gradually lengthened. Referring to FIG. 5, the first rotation direction should be a clockwise direction, so that the first guiding wheel 121 rotates to transfer a portion of the second segment D2 to the first segment D1.

The first through fourth rotational angles are related to the first through fourth driven lengths and the circumferential lengths of the first through fourth guiding wheels 121 to 124. Specifically, the first rotation angle is equal to the first driven length divided by the circumferential length of the first guiding wheel 121, and then multiplied by 360 degrees; the second rotation angle is equal to the second driven length divided by the circumference length of the second guiding wheel 122, and then multiplied by 360 degrees; the third rotation angle and the fourth rotation angle are similar to the above. Taking the first rotation angle as an example, assuming that the first driving length is 20 cm, and the circumference length of the first guiding wheel 121 is 10 cm, then the first guiding wheel 121 needs to rotate 2 times to drive the guiding rope 22 to move 20 cm. As such, the first rotation angle is 720 degrees, in terms of 360 degrees being one rotation.

The first rotation speed to the fourth rotation speed are obtained in such a manner that the first driven length to the fourth driven length divided by the predetermined rotation time, respectively. For example, the first driven length is 20 cm, the second driven length is 40 cm, and the predetermined rotation time is 4 seconds, then the first rotation speed is 5 cm/sec (20 cm divided by 4 seconds), and the second rotation speed is 10 cm/sec (40 cm divided by 4 seconds). In this way, the time taken by the first guiding wheel 121, the second guiding wheel 122, the third guiding wheel 123, and the fourth guiding wheel 124 to respectively rotate the first rotation angle, the second rotation angle, the third rotation angle, and the fourth rotation angle, are the same with each other. So that the moving module 10 can be more smoothly operated.

Then, based on the displacement control data, the input control unit 23 controls the first to fourth drivers 131 to 134 to drive the first to fourth guiding wheels 121 respectively, so as to drive the guiding rope 22 and to change the lengths of the first segment D1 to the eighth segment D8. In detail, the input control unit 23 controls the first driver 131 in the first rotation speed to rotate the first rotation angle toward the first rotation direction; and controls the second driver 132 in the second rotation speed to rotate the second rotation angle toward the second rotation direction; and so on.

Next, the sensor 31 detects the tension of the guiding rope 22, and controls the rope retractor 32 to extend or retract the guiding rope 22 according to a result of detecting and thereby maintain the tension of the guiding rope 22 in a predetermined range. In the illustrated embodiment, the sensor 31 detects the tension of the eighth segment D8 of the guiding rope 22, and when the tension of the eighth segment D8 is too high (i.e., too tight), the sensor 31 controls the rope retractor 32 to release the guiding rope 22 from the adjustment end 222. On the other hand, when the tension of the eighth segment D8 is too low (i.e., too loose), the sensor 31 controls the rope retractor 32 to roll up the guiding rope 22. So and so, until the moving module 10 moves to the target position.

At this time, the input control unit 23 can automatically control the manipulator 14 to automatically grasp or release the target object according to practical needs.

In general, based on the cooperation of the moving module 10, the controlling module 20 and the assisting module 30, through an optimized operation mode, the moving module 10 can be easily moved to any position in the cabinet body 101; the manipulator 14 of the moving module 10 can automatically grasp or release a target object, thereby enabling the smart cabinet 100 more efficient and intelligent. In addition, the clamping mechanism 142 of the moving module 10 forms a hollow cylindrical structure, which can protect the target object from being damaged when grasping or loosening a fragile or deformable object, so it can be applied to special industries.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A smart cabinet comprising: a cabinet body, a moving module, a controlling module and an assisting module; the moving module being positioned in the cabinet body, and the controlling module being connected to the moving module and configured for controlling a movement of the moving module;

wherein the moving module comprises a base, a guiding wheel group disposed on the base, a plurality of drivers pivotally connected with the guiding wheel group, and a manipulator disposed on the base;

wherein the controlling module comprises an input control unit, a guiding rope and a pulley group; the input control unit is electrically connected with the plurality of drivers and the manipulator, the pulley group comprises a plurality of pulleys respectively positioned at predetermined end points, and the plurality of pulleys cooperate to define a movement range for the moving module;

wherein the assisting module comprises a rope retractor and a sensor electrically connected with the rope retractor, and two ends of the guiding rope are coupled to the rope retractor;

wherein the input control unit is configured for generating displacement control signals correspondingly when receives a displacement instruction, and controlling the plurality of drivers to drive the guiding wheel group to rotate and thereby drive the guiding rope according to the displacement control signals, so as to change a position of the moving module;

wherein the sensor is configured for detecting a tension of the guiding rope, and controlling the rope retractor to extend or retract the guiding rope according to a result of the detecting and thereby maintain the tension of the guiding rope in a predetermined range, so as to make the moving module move to a target position in the movement range corresponding to the displacement instruction;

wherein the manipulator comprises a telescopic mechanism and a clamping mechanism, the telescopic mechanism is arranged between the base and the clamping mechanism, and the clamping mechanism is configured for clamping or releasing a target object.

2. The smart cabinet according to claim 1, wherein the guiding wheel group comprises a first guiding wheel, a second guiding wheel, a third guiding wheel and a fourth guiding wheel spaced apart from one another and respectively positioned at four corners of the base;

wherein the plurality of drivers comprises four drivers respectively configured for driving the first guiding wheel, the second guiding wheel, the third guiding wheel and the fourth guiding wheel;
wherein the pulley group comprises a first pulley, a second pulley, a third pulley and a fourth pulley respectively disposed at four endpoints of a quadrilateral; and the first pulley, the second pulley, the third pulley and the fourth pulley cooperate to define the movement range of the moving module in a quadrilateral shape;
wherein the guiding rope comprises a first segment between the rope retractor and the first guiding wheel, a second segment extending from the first guiding wheel to the second pulley, a third segment extending from the second pulley to the second guiding wheel, a fourth segment extending from the second guiding wheel to the third pulley, a fifth segment extending from the third pulley to the third guiding wheel, a sixth segment extending from the third guiding wheel to the fourth pulley, a seventh segment extending from the fourth pulley to the fourth guiding wheel, and an eighth segment extending from the fourth guiding wheel to the first pulley;
wherein the input control unit is concretely configured for generating the displacement control signals correspondingly when receives the displacement instruction, and controlling the plurality of drivers to drive at least some of the first guiding wheel, the second guiding wheel, the third guiding wheel and the fourth guiding wheel to rotate and thereby drive the guiding rope according to the displacement control signals, so as to change a length(s) of at least some of the first segment, the second segment, the third segment, the fourth segment, the fifth segment, the sixth segment, the seventh segment and the eighth segment.

3. The smart cabinet according to claim 2, wherein the four drivers comprises a first driver configured for driving the first guiding wheel, a second driver configured for driving the second guiding wheel, a third driver configured for driving the third guiding wheel, and a fourth driver configured for driving the fourth guiding wheel;
wherein the displacement control signals comprise a first rotation direction and a first rotation angle both corresponding to the first driver, a second rotation direction and a second rotation angle both corresponding to the second driver, a third rotation direction and a third rotation angle both corresponding to the third driver, and a fourth rotation direction and a fourth rotation angle both corresponding to the fourth driver; and each of the first rotation direction, the second rotation direction, the third rotation direction and the fourth rotation direction is a clockwise rotation direction or a counterclockwise rotation direction.

4. The smart cabinet according to claim 3, wherein the displacement control signals further comprise a first rotation speed corresponding to the first driver, a second rotation speed corresponding to the second driver, a third rotation speed corresponding to the third driver, and a fourth rotation speed corresponding to the fourth driver;
wherein the input control unit is configured for controlling the first driver to drive the first guiding wheel in the first rotation speed to rotate the first rotation angle, controlling the second river to drive the second guiding wheel in the second rotation speed to rotate the second rotation angle, controlling the third driver to drive the third guiding wheel in the third rotation speed to rotate the third rotation angle, and controlling the fourth driver to drive the fourth guiding wheel in the fourth rotation speed to rotate the fourth rotation angle; the first through fourth guiding wheels take a same time to rotate the first through fourth rotation angles respectively.

5. The smart cabinet according to claim 4, wherein the input control unit is configured for generating target coordinates according to the displacement instruction before generating the displacement control signals after receives the displacement instruction, and then generating the displacement control signals based on the target coordinates and initial coordinates; the target coordinates represent the target position that the moving module is to reach by displacement, and the initial coordinates represent an initial position of the moving module before displacement;
wherein the input control unit is concretely configured for generating the displacement control signals comprising:
calculating a first length variation corresponding to the first segment, a second length variation corresponding to the second segment, a third length variation corresponding to the third segment, a fourth length variation corresponding to the fourth segment, a fifth length variation corresponding to the fifth segment, a sixth length variation corresponding to the sixth segment, a seventh length variation corresponding to the seventh segment and an eighth length variation corresponding to the eighth segment, according to the initial coordinates and the target coordinates;
determining the first rotation direction, the second rotation direction, the third rotation direction and the fourth rotation direction, according to the first through eighth length variations; and calculating the first rotation angle, the second rotation angle, the third rotation angle and the fourth rotation angle; and
determining the first rotation speed, the second rotation speed, the third rotation speed and the fourth rotation speed, according to the first rotation angle, the second rotation angle, the third rotation angle, the fourth rotation angle and a predetermined rotation time.

6. The smart cabinet according to claim 5, wherein the input control unit is configured for calculating a first driven length corresponding to the first guiding wheel, a second driven length corresponding to the second guiding wheel, a third driven length corresponding to the third guiding wheel and a fourth driven length corresponding to the fourth guiding wheel, according to the first through eighth length variations, and the calculating comprising following formulas:

$$\Delta Cn = Cn - Cn';$$

$$\Delta Ca = \Delta C1 = C1 - C1';$$

$$\Delta Cb = \Delta C2 + \Delta C3 + \Delta Ca = C2 - C2' + C3 - C3' + \Delta Ca;$$

$$\Delta Cc = \Delta C4 + \Delta C5 + \Delta Cb = C4 - C4' + C5 - C5' + \Delta Cb;$$

$$\Delta Cd = \Delta C6 + \Delta C7 + \Delta Cc = C4 - C4' + C5 - C5' + \Delta Cb;$$

where Cn refers to an initial length of an nth segment of the guiding rope, Cn' refers to a target length of the nth segment of the guiding rope, $\Delta Cn$ refers to a difference between the initial length and the target length of the nth segment, $\Delta Ca$ refers to the first driven length, $\Delta Cb$ refers to the second drivenlength, $\Delta Cc$ refers to the third driven length, $\Delta Cd$ refers to the fourth driven length.

7. The smart cabinet according to claim 2, wherein the two ends of the guiding rope are respectively a fixed end and an adjusting end opposite to the fixed end, the rope retractor is configured for extending or retracting the guiding rope by use of the adjusting end, and the sensor is configured for detecting a tension of one of the first and the eighth segments which is more adjacent to the adjusting end.

8. The smart cabinet according to claim 1, wherein the clamping mechanism comprises a frame, one end of the frame connected with the telescopic mechanism is formed with a limited opening, and the other opposite end of the frame is formed with an adjustable opening.

9. The smart cabinet according to claim 8, wherein the clamping mechanism further comprises an elastic element disposed at an end where the adjustable opening is located.

10. The smart cabinet according to claim 9, wherein the clamping mechanism further comprises a supporting member and a plurality of cushions; the supporting member is connected with the elastic element and positioned at the adjustable opening of the frame, the cushions are positioned at an inner side of the supporting member, and the supporting member comprises a plurality of elastic sheets.

\* \* \* \* \*